United States Patent
Lee et al.

(10) Patent No.: US 11,527,682 B2
(45) Date of Patent: Dec. 13, 2022

(54) LED LIGHTING APPARATUS HAVING IMPROVED COLOR LENDERING AND LED FILAMENT

(71) Applicant: SEOUL SEMICONDUCTOR CO., LTD., Ansan-si (KR)

(72) Inventors: Jong Kook Lee, Ansan-si (KR); Jun Myung Song, Ansan-si (KR); Seong Jin Lee, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 167 days.

(21) Appl. No.: 16/649,144

(22) PCT Filed: Feb. 7, 2019

(86) PCT No.: PCT/KR2019/001534
§ 371 (c)(1),
(2) Date: Mar. 20, 2020

(87) PCT Pub. No.: WO2019/164160
PCT Pub. Date: Aug. 29, 2019

(65) Prior Publication Data
US 2020/0295237 A1    Sep. 17, 2020

(30) Foreign Application Priority Data
Feb. 23, 2018    (KR) .................... 10-2018-0022178

(51) Int. Cl.
*H01L 33/50* (2010.01)
*F21K 9/23* (2016.01)
(Continued)

(52) U.S. Cl.
CPC ........ *H01L 33/504* (2013.01); *C09K 11/7777* (2013.01); *F21K 9/23* (2016.08);
(Continued)

(58) Field of Classification Search
CPC .......................... H01L 33/502; H01L 33/504
See application file for complete search history.

(56) References Cited

U.S. PATENT DOCUMENTS

| 8,921,875 B2 | 12/2014 | LeToquin et al. |
| 10,228,093 B2 | 3/2019 | Jiang et al. |

(Continued)

FOREIGN PATENT DOCUMENTS

| CN | 106468405 | 3/2017 |
| WO | 2006013513 | 2/2006 |

(Continued)

OTHER PUBLICATIONS

Oh Ji Hye et al., Journal of Materials Chemistry C, "Evaluation of new color metrics: guidelines for developing narrow-band red phosphors for WLEDsm", vol. 4, No. 36, pp. 8326-8348, published on Sep. 29, 2016.

(Continued)

*Primary Examiner* — Andrew J Coughlin
(74) *Attorney, Agent, or Firm* — H.C. Park & Associates, PLC

(57) ABSTRACT

A lighting apparatus including at least one light emitting diode (LED) chip configured to emit blue light; a green phosphor having a light emission peak in a range of 500 nm to 550 nm; and a red phosphor having a light emission peak in a range of 600 nm to 650 nm, in which the red phosphor includes a first red phosphor having a light emission peak in a range of 620 nm to 630 nm and a second red phosphor having a light emission peak in a range of 630 nm to 640 nm, and the full widths at half maximum of the first and second red phosphors are in a range of 20 nm to 60 nm, respectively.

13 Claims, 6 Drawing Sheets

(51) Int. Cl.
*F21K 9/64* (2016.01)
*C09K 11/77* (2006.01)
*H01L 25/075* (2006.01)
*H01L 33/30* (2010.01)
*F21Y 115/10* (2016.01)

(52) U.S. Cl.
CPC ............ *F21K 9/64* (2016.08); *H01L 25/0753* (2013.01); *H01L 33/30* (2013.01); *F21Y 2115/10* (2016.08)

(56) References Cited

U.S. PATENT DOCUMENTS

| | | | |
|---|---|---|---|
| 10,669,478 B2 | 6/2020 | Oepts et al. | |
| 2006/0071589 A1* | 4/2006 | Radkov | C09K 11/774 313/487 |
| 2007/0080326 A1* | 4/2007 | Fiedler | C09K 11/7728 313/503 |
| 2008/0093979 A1 | 4/2008 | Bechtel et al. | |
| 2008/0123024 A1* | 5/2008 | Han | H01J 1/63 349/71 |
| 2008/0182127 A1 | 7/2008 | Oshio | |
| 2010/0283382 A1 | 11/2010 | Kwak et al. | |
| 2012/0162965 A1 | 6/2012 | Takeuchi et al. | |
| 2016/0273717 A1 | 9/2016 | Krames et al. | |
| 2016/0372638 A1 | 12/2016 | Todorov et al. | |
| 2017/0040504 A1 | 2/2017 | Chen et al. | |
| 2019/0055468 A1* | 2/2019 | Oepts | H01L 33/507 |
| 2020/0313048 A1* | 10/2020 | Yao | H01L 33/62 |

FOREIGN PATENT DOCUMENTS

| | | |
|---|---|---|
| WO | 2012154289 | 11/2012 |
| WO | 2017071954 | 5/2017 |

OTHER PUBLICATIONS

Jia Dongdong et al., Optical Materials, "Alkali earth sulfide phosphors doped with Eu2+ and Ce3+ for LEDs", vol. 30, No. 3, pp. 375-379, published on Jan. 24, 2007.

Dong Luo et al., RSC Advances, "Realizing superior white LEDs with both high R9 and luminous efficacy by using dual red phosphors", vol. 7, No. 42, pp. 25964-25968, published on Jan. 1, 2017.

European Search Report dated Mar. 18, 2021, issued to European Patent Application No. EP19756490.9.

International Search Report dated May 1, 2019, issued in International Patent Application No. PCT/KR2019/001534.

Luo et al., Realizing Superior White LEDs with Both High R9 and Luminous Efficacy by using Dual Red Phosphors, The Royal Society of Chemistry, May 16, 2017, pp. 25964-25968, Issue 42.

\* cited by examiner

LED LIGHTING APPARATUS HAVING IMPROVED COLOR LENDERING AND LED FILAMENT

CROSS-REFERENCE TO RELATED APPLICATIONS

This application is a National Stage Entry of International Patent Application No. PCT/KR2019/001534, filed on Feb. 7, 2019, and claims priority from and the benefit of Korean Patent Application No. 10-2018-0022178, filed on Feb. 23, 2018, each of which is hereby incorporated by reference for all purposes as if fully set forth herein

BACKGROUND

Field

Exemplary embodiments of the present disclosure relate to a lighting apparatus, and, more particularly, to an LED lighting apparatus and an LED filament having improved color rendering.

Discussion of the Background

Light bulbs typically generate light using metal filaments, such as tungsten. However, light bulbs with metal filaments are quickly being replaced by LED lamps because conventional light bulbs have shorter lifespan, lower light efficiency, and higher power consumption than LED lamps.

An LED lighting apparatus, such as an LED lamp, generally uses LEDs that emit light in the blue region as a light source. In particular, the LED lighting apparatus that implements white light uses a phosphor along with the LEDs.

High color rendering is generally required for lighting apparatuses that implement white light. Color rendering is an illumination property of a light source that indicates how similar an object color irradiated by the lighting apparatus is to an object color irradiated by a reference light source. The color rendering is evaluated by the color rendering index (CRI), and a general color rendering index (Ra) is widely used. Ra is the average value of the individual color rendering indices (special CRIs; R1 to R8) quantified using eight test color samples.

In general, when Ra exhibits a high value, the color rendering of the illumination light source is considered high. However, increasing Ra in a lighting apparatus using a blue LED as the light source generally leads to a decrease in the luminous intensity, thereby increasing power consumption. Furthermore, since Ra is the average value of individual color rendering indices, high Ra does not necessarily mean that R1 to R8 are all evenly high. In particular, since the LED lighting apparatus using the blue LED lacks light in the red region, the value of R8 measured using a test color sample having a high reflectance in the pink region is generally relatively low compared to R1 to R7. Therefore, there is a need for an LED lighting apparatus capable of increasing R8 while achieving appropriate Ra.

While the phosphor in the red region may be added to sufficiently increase the value of R8, in this case, unnecessary light may be generated due to a considerable amount of tail generated in the emission spectrum of the red phosphor, thereby deteriorating the efficiency of the lighting apparatus. A mainly used nitride-based red phosphor, such as $CaAlSiN_3:Eu^{2+}$, has a full width at half maximum of about 80 nm or more, and when a nitride phosphor having an emission peak of about 650 nm is used, a considerable amount of light is generated even in a region of 700 nm or more. Accordingly, when the amount of red phosphor is increased to increase R8, Ra is increased as a whole and the overall luminous intensity of the lighting apparatus is lowered. That is, it is difficult to increase R8 without reducing the luminous intensity of the lighting apparatus with the nitride-based red phosphor. In addition, although the luminous intensity may be increased by increasing the number of lighting apparatuses or increasing the number of LEDs and an amount of phosphors in the lighting apparatus, such would undesirably increase power consumption.

Recently, $K_2SiF_6:Mn^{4+}$(KSF) has been used as the red phosphor having a narrow full width at half maximum. The KSF phosphor has a very narrow full width at half maximum of less than about 10 nm, and, accordingly, is a phosphor capable of implementing good color reproducibility. When using the red phosphor having the narrow full width at half maximum, such as KSF, it is possible to remove unnecessary tails and emit light in the desired red region, thereby achieving high R8 even with relatively low Ra. That is, appropriate Ra and R8 may be achieved without significantly reducing the luminous intensity. However, since the full width at half maximum is narrow, there is a problem that an amount of the KSF phosphor used is more considerably increased than when the nitride-based red phosphor is used. In general, when the KSF phosphor is used, the amount of phosphor used may be increased by six times or more than when using the nitride-based phosphor, thus, increasing R8 by using KSF may not be a proper choice. In addition, the KSF phosphor is relatively expensive compared to other red phosphors, and is difficult to purchase as a phosphor, and thus, there are many restrictions in using the KSF.

SUMMARY

Exemplary embodiments provide a LED lighting apparatus capable of improving R8 while preventing the reduction of the luminous intensity of the lighting apparatus.

Exemplary embodiments also provide an LED lighting apparatus capable of increasing R8 without increasing an amount of phosphor used.

Additional features of the inventive concepts will be set forth in the description which follows, and in part will be apparent from the description, or may be learned by practice of the inventive concepts.

A lighting apparatus according to an exemplary embodiment includes: a light emitting diode chip emitting blue light; a green phosphor having an emission peak in a range of 500 nm to 550 nm; and a red phosphor having an emission peak in a range of 600 nm to 650 nm, in which the red phosphor includes: a first red phosphor having an emission peak in a range of 620 nm to 630 nm; and a second red phosphor having an emission peak in a range of 630 nm to 640 nm, in which full widths at half maximum of the first red phosphor and the second red phosphor are in a range of 20 nm to 60 nm, respectively.

A general color rendering index (Ra) of the lighting apparatus may be in a range of 80 to 98, and an R8 thereof may be greater than 72.

The first red phosphor and the second red phosphor may include (Ca, Sr)S:Eu-based phosphors. However, the inventive concepts are not limited to a specific sulfide phosphor, and other red phosphors whose emission peak and full width at half maximum satisfy the above conditions may be used.

Full widths at half maximum of the first red phosphor and the second red phosphor may be in a range of 50 nm to 60 nm.

The green phosphor may include a $Lu_3(Al, Ga)_5O_{12}$:Ce (LuAG)-based phosphor.

The lighting apparatus may further include a yellow phosphor having an emission peak in a range of 550 nm to 600 nm.

A mixing ratio of the green phosphor, the yellow phosphor, and the red phosphor may be adjusted to obtain a desired color rendering index. In addition, since two kinds of red phosphors having a relatively narrow full width at half maximum are used, desired R8 may be achieved without reducing the luminous intensity.

The lighting apparatus may include an LED filament. The LED filament may include: a supporting substrate on which the LED chips are disposed; wires electrically connecting the LED chips; and an encapsulant covering the LED chips, in which the green phosphor and red phosphor may be distributed in the encapsulant. Further, the encapsulant may surround the supporting substrate.

An LED filament according to another exemplary embodiment may include: a supporting substrate; a plurality of light emitting diode chips disposed on the supporting substrate, and emitting blue light; and an encapsulant covering the plurality of light emitting diode chips and having phosphors distributed therein, in which the phosphors may include: a green phosphor having an emission peak in a range of 500 nm to 550 nm; and a red phosphor having an emission peak in a range of 600 nm to 650 nm, in which the red phosphor may include: a first red phosphor having an emission peak in a range of 620 nm to 630 nm; and a second red phosphor having an emission peak in a range of 630 nm to 640 nm, in which full widths at half maximum of the first red phosphor and the second red phosphor are in a range of 20 nm to 60 nm, respectively.

Ra of the LED filament ray be in a range of 80 to 98, and R8 may be greater than 72.

The first red phosphor and the second red phosphor may include (Ca, Sr)S:Eu-based phosphors.

Full widths at half maximum of the first red phosphor and the second red phosphor may be in a range of 50 nm to 60 nm.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
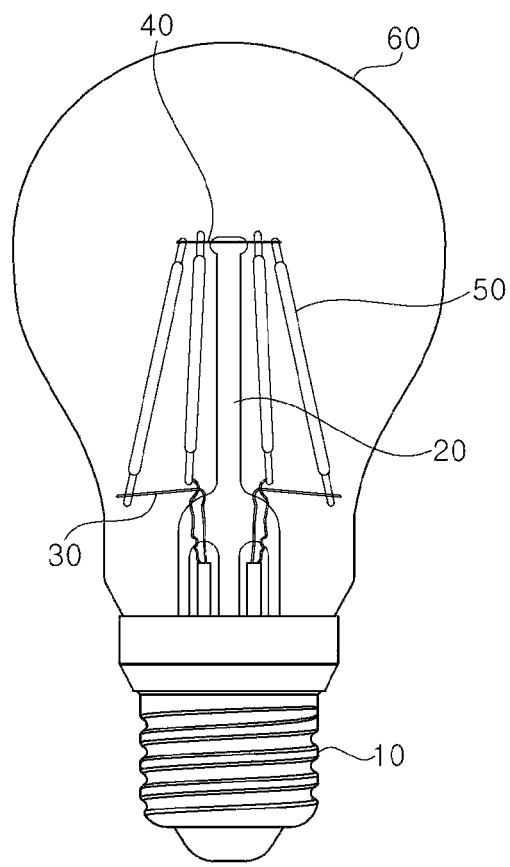
FIG. 1 is a schematic front view illustrating an LED lamp according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, an LED lighting apparatus will be described with reference to an LED lamp. However, the inventive concepts are not limited thereto, and the LED lighting apparatus may be employed in various other types of lighting apparatuses.

FIG. 1 is a schematic front view illustrating an LED lamp according to an exemplary embodiment.

Referring to FIG. 1, the LED lamp includes a bulb base 10, a center pillar 20, a lower lead wire 30, an upper lead wire 40, an LED filament 50, and a light transmissive bulb 60.

The bulb base 10 may have an electrode structure that may be used in a conventional light bulb. In addition, passive and active devices, such as an AC/DC converter, may be built in the bulb base 10.

Since the bulb base 10 may have the same electrode structure as that of the conventional light bulb, the LED lamp according to an exemplary embodiment may be used in a conventional socket. As such, installation costs of additional facilities from using the LED lamp may be saved.

The center pillar 20 is fixed to the bulb base 10, and disposed at a center of the LED lamp. The center pillar 20 may include a supporter, a pillar, and an upper end. The center pillar 20 is for supporting the LED filaments 50, and, for example, may be formed of glass.

The lower lead wire 30 electrically connects the bulb base 10 and the LED filament 50. The lower lead wire 30 is coupled to a lower end portion of the LED filament 50. The lower lead wire 30 is connected to each LED filament 50. More particularly, the lower lead wires 30 are divided into two groups, and are connected to two electrodes of the bulb base 10, respectively.

The upper lead wire 40 is coupled to an upper end portion of the LED filaments 50. A single upper lead wire 40 may connect a pair of LED filaments 50 to each other. In the illustrated exemplary embodiment, two pairs of LED filaments 50 are shown, with two upper lead wires 40 connecting the two pairs of LED filaments 50 in series. However, the inventive concepts are not limited thereto, and in some exemplary embodiments, a pair or three or more pairs of LED filaments 50 connected to each other through the upper lead wire 40 may be disposed.

The light transmissive bulb 60 surrounds the LED filament 50, and is separated from an external environment. The light transmissive bulb 60 may be formed of glass or plastic. The light transmissive bulb 60 may have various shapes, and may have the same shape as the conventional bulb.

The LED filament 50 is electrically connected to the bulb base 10 through the lower lead wire 30 and the upper lead wire 40. A structure of the LED filament 50 will be described in detail with reference to FIG. 2 and FIG. 3.

Figure 2:
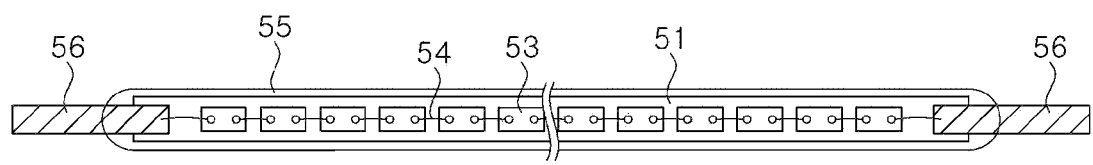
FIG. 2 is a schematic plan view illustrating an LED filament according to an exemplary embodiment.
Figure 3A:
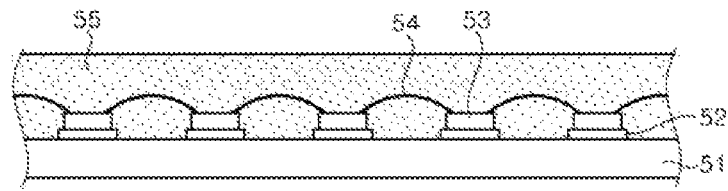
FIGS. 3A and 3B show partially enlarged cross-sectional views of an LED filament according to exemplary embodiments.
Figure 3B:
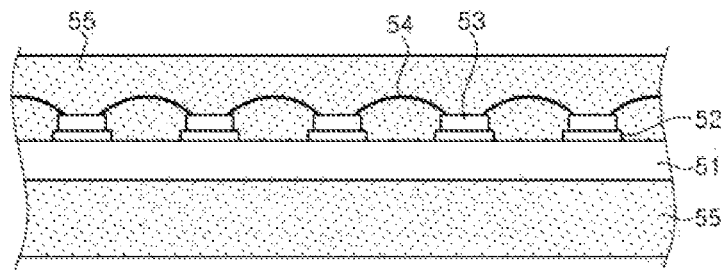

FIG. 2 is a schematic plan view illustrating an LED filament according to an exemplary embodiment, and FIGS. 3A and 3B show partially enlarged cross-sectional views of an LED filament according to exemplary embodiment.

Referring to FIG. 2 and FIGS. 3A and 3B, the LED filament 50 may include a supporting substrate 51, a light emitting diode chip 53, a bonding wire 54, an encapsulant 55, and first and second metal plates 56. In addition, an adhesive 52 for bonding the light emitting diode chip 53 to the supporting substrate 51 may be disposed between the light emitting diode chip 53 and the supporting substrate 51.

In addition, the first and second metal plates 56 may also be attached to the supporting substrate 51 using the adhesive.

The supporting substrate 51 has an elongated shape, such as a bar. The supporting substrate 51 may also have a first surface and a second surface opposite to the first surface. The supporting substrate 51 may be formed of a transparent substance, such as sapphire, quartz, or glass, but is not limited thereto, and may be formed of various kinds of transparent or opaque ceramics.

The LED chips 53 are disposed on the supporting substrate 51. The light emitting diode chips 53 may be disposed on the first surface of the supporting substrate 51, or may be disposed on both of the first surface and the second surface. The light emitting diode chips 53 may be bonded onto the supporting substrate 51 without an adhesive using a wafer bonding technique, or may be bonded onto the supporting substrate 51 using the adhesive 52. In an exemplary embodiment, a transparent adhesive is used for the adhesive 52, and, in another exemplary embodiment, the adhesive 52 may include wavelength converting substances, such as phosphors or quantum dots.

The bonding wires 54 electrically connect the LED chips 53. The LED chips 53 may be connected in series through the bonding wires 54 as shown in the drawings. The upper lead wire 40 of FIG. 1 may connect a pair of LED filaments 50 to each other in series. The LED chips 53 disposed at both end portions of the supporting substrate 51 are electrically connected to the first and second metal plates 56, respectively. These light emitting diode chips 53 may also be electrically connected to the first and second metal plates 56 through the bonding wire 54.

The encapsulant 55 covers the light emitting diode chips 53, and also covers the bonding wires 54. The encapsulant 55 may also partially cover the first and second metal plates 56. Although the encapsulant 55 may cover the LED chips 53 on the first surface of the supporting substrate 51 as shown in FIG. 3A, according to another exemplary embodiment, the encapsulant 55 may be formed to surround all of the first and second surfaces of the supporting substrates as shown in FIG. 3B. The encapsulant 55 may include phosphors converting wavelengths of light emitted from the light emitting diode chips 53. The phosphors in the encapsulant 55 will be described in detail later.

The first and second metal plates 56 are coupled to the supporting substrate 51. The first and second metal plates 56 may be attached to the supporting substrate 51 through an adhesive, but are not limited thereto, and may be coupled to the supporting substrate 51 in various ways.

As described with reference to FIG. 1, one end portion of the LED filament 50 is connected to the lower lead wire 30, and the other end portion is connected to the upper lead wire 40. In this case, the first and second metal plates 56 may be coupled to the lower lead wire 30 and the upper lead wire 40 by soldering, welding, or the like.

In addition, the lower lead wire 30 and the upper lead wire 40 may have elasticity, and, accordingly, when the LED filament 40 expands or contracts with heat, the lower and upper lead wires 30 and 40 may bent.

Figure 4:
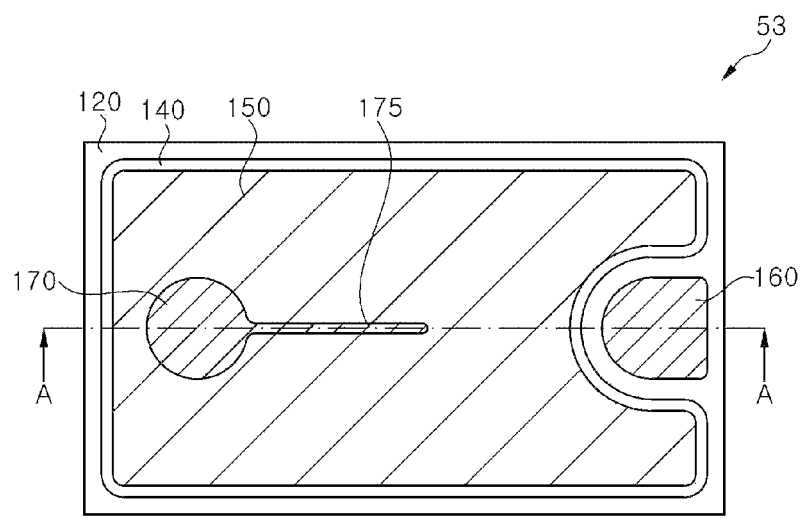
FIG. 4 is a schematic plan view of a light emitting diode chip mounted on an LED filament according to an exemplary embodiment.
Figure 5:
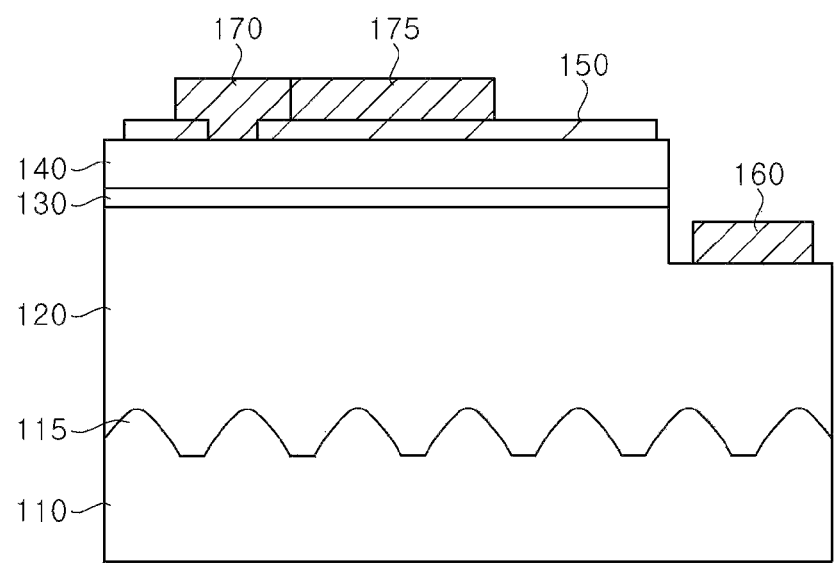
FIG. 5 is a cross-sectional view taken along the line A-A of FIG. 4.

FIG. 4 is a schematic plan view of a light emitting diode chip 53 mounted on an LED filament according to an exemplary embodiment, and FIG. 5 is a cross-sectional view taken along line A-A of FIG. 4.

Referring to FIG. 4 and FIG. 5, the light emitting diode chip 53 may include a growth substrate 110, an n-side semiconductor layer 120, an active layer 130, a p-side semiconductor layer 140, and a transparent electrode 150, an n-electrode 160, and a p-electrode 170.

The growth substrate 110 is a substrate suitable for growing a gallium nitride-based semiconductor layer thereon, and may be a transparent substrate transmitting light generated in the active layer 130. For example, the growth substrate 110 may be a sapphire substrate, a gallium nitride substrate, an aluminum nitride substrate, or the like, and, in particular, may be a patterned sapphire substrate. FIG. 5 exemplarily shows the patterned sapphire substrate, in which protrusions 115 are formed on a upper surface of the substrate 110.

A semiconductor stacked structure including the n-side semiconductor layer 120, the active layer 130, and the p-side semiconductor layer 140 is disposed on the growth substrate 110.

The transparent electrode 150 may be disposed on the p-side semiconductor layer 140 and contact the p-side semiconductor layer 140. The transparent electrode 150 transmits light generated in the active layer 130. The transparent electrode 150 may be formed of a transparent oxide film, such as indium-tin-oxide (ITO), ZnO, or the like, or a transparent metal, such as Ni/Au, or the like.

Portions of the p-side semiconductor layer 140 and the active layer 130 may be removed to expose the n-side semiconductor layer 120. The n-electrode 160 is formed on the exposed n-side semiconductor layer 120, and electrically connected to the n-side semiconductor layer 120. The n-electrode 160 may be in ohmic contact with the n-side semiconductor layer 120, and may be formed of, for example, Ti/Al.

The p-electrode 170 is formed on the transparent electrode 150. A portion of the transparent electrode 150 may have an opening exposing the p-side semiconductor layer 140, and the p-electrode 170 may contact the p-side semiconductor layer 140 through the opening formed in the transparent electrode 150. The p-electrode 170 may include a reflective layer for reflecting light incident from the active layer 130. For example, the p-electrode 170 may be formed of Al/Ti/Pt/Au.

An extension 175 may extend from the p-electrode 170 toward the n-electrode 160. The extension 175 may and the p-electrode 170 may be formed together and may include substantially the same material.

The semiconductor stacked structure disposed on the growth substrate 110 includes the n-side semiconductor layer 120, the active layer 130, and the p-side semiconductor layer 140 as described above. The semiconductor stacked structure described herein may be formed of a gallium nitride-based semiconductor layer, and may be grown on the growth substrate 110 using a metal organic chemical vapor deposition method, a hydride vapor deposition method, or the like.

The n-side semiconductor layer 120 may have a single layer or a multilayer structure. For example, the n-side semiconductor layer 120 may include a buffer layer and an n-type contact layer. The buffer layer may be formed of GaN, and may be formed to reduce crystal defects due to lattice mismatch between the growth substrate 110 and the semiconductor layer.

The active layer 130 may have a single quantum well structure or a multiple quantum well structure. In particular, the active layer 130 may have a multiple quantum well structure in which a barrier layer and a well layer are alternately stacked, and thus, the internal quantum efficiency may be improved.

The p-side semiconductor layer 140 may have a single layer or a multilayer structure, and may include, for example, an electron blocking layer and a p-type contact layer.

The electron blocking layer is disposed on the active layer 130, and confines electrons in the active layer 130 to improve recombination rate. The electron blocking layer may be formed of AlGaN or AlInGaN.

The p-type contact layer is a layer doped with a p-type impurity, such as Mg, and the transparent electrode 150 is electrically connected to the p-type contact layer.

Although the light emitting diode chip 53 according to one exemplary embodiment has been described, the inventive concepts are not limited to the illustrated light emitting diode chip, and various kinds of blue light emitting diode chips may be used in other exemplary embodiments.

The light emitting diode chip 53 may have a light emission peak in the blue region, for example, in a range of 450 nm to 470 nm, and further in a range of 450 nm to 460 nm. Phosphors included in the encapsulant 55 may convert light emitted from the light emitting diode chip 53.

In particular, the phosphor includes a green phosphor having an emission peak in a range of 500 nm to 550 nm and a red phosphor having an emission peak in a range of 600 nm to 650 nm. Further, in the illustrated exemplary embodiment, the red phosphor includes a first red phosphor having an emission peak in a range of 620 nm to 630 nm and a second red phosphor having an emission peak in a range of 630 nm to 640 nm. Full widths at half maximum of the first red phosphor and the second red phosphor may be in a range of 20 nm to 60 nm, respectively, and may be further, in a range of 40 nm to 60 nm, specifically, in a range of 50 nm to 60 nm. The first and second red phosphors may be, for example, $(Ca, Sr)S:Eu^{2+}$-based sulfide phosphors, without being limited thereto.

The red phosphor having the full width at half maximum of 20 nm to 60 nm may improve R8 without reducing the luminous intensity of the lighting apparatus because a tail region of the unnecessary wavelength band is small. Moreover, since the full width at half maximum is not extremely narrow like that of the KSF phosphor, the amount of the phosphor used to improve R8 according to an exemplary embodiment may not need to be increased.

Furthermore, the first red phosphor having the emission peak in the range of 620 nm to 630 nm and the second red phosphor having the emission peak in the range of 630 nm to 640 nm are used together, and thus, a relatively large region of the red region for improving R8 may be easily covered. Accordingly, it is possible to reduce the amount of phosphor used for achieving an equivalent Ra as compared to using a nitride-based phosphor.

The green phosphor has an emission peak in a range of 500 nm to 550 nm. The green phosphor is not particularly limited, but a $Lu_3(Al, Ga)_5O_{12}:Ce$ (LuAG)-based phosphor, a silicate phosphor, such as $Ba_2MgSi_2O_7:Eu^{2+}$, $Ba_2SiO_4:Eu^{2+}$, $Ca_3(Sc, Mg)_2Si_3O_{12}:Ce^{3+}$, or the like, or a sulfide phosphor, such as $(Sr, Ca)Ga_2S_4:Eu^{2+}$, or the like may be used, for example. In particular, the green phosphor may have a full width at half maximum in a range of 90 nm to 130 nm, thereby covering a relatively wide wavelength region.

The phosphor may further include a yellow phosphor. For example, a YAG phosphor or a silicate phosphor may be used. The yellow phosphor may have an emission peak in a range of 550 nm to 600 nm, and may have a wide full width at half maximum of 100 nm or more, like the green phosphor.

Figure 6:
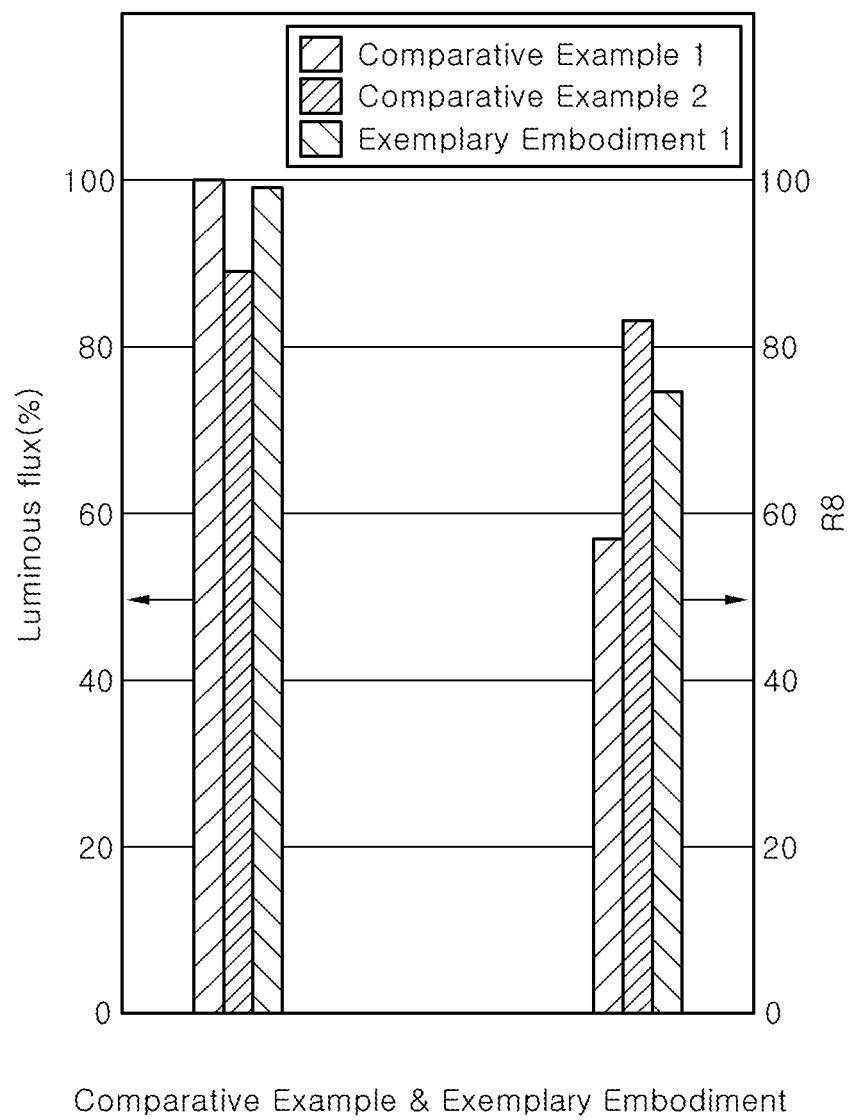
FIG. 6 is a graph showing luminous fluxes and R8s of lighting apparatuses according to comparative examples and an exemplary embodiment.

FIG. 6 is a graph showing luminous fluxes and R8 of lighting apparatuses according to comparative examples and an exemplary embodiment.

In the lighting apparatus of the comparative examples and that of the exemplary embodiment, LED chips of the same type were disposed on a supporting substrate, and the supporting substrate was covered with an encapsulant including a phosphor. In addition, except for a red phosphor, homologous LuAG-based phosphors and YAG phosphors were used. Meanwhile, for the comparative example, two kinds of nitride-based phosphors were used as red phosphors, and two kinds $(Ca, Sr)S:Eu^{2+}$ sulfide phosphors were used as red phosphors for the exemplary embodiment.

The nitride-based phosphors had emission peaks of about 635 nm and 646 nm, and full widths at half maximum thereof were about 92.5 nm and 87.5 nm, respectively. On the other hand, the sulfide phosphors had emission peaks of about 626 nm and 634 nm, and full widths at half maximum thereof were about 53.5 nm and about 56.5 nm, respectively.

A mixing ratio of these phosphors was adjusted to prepare Comparative Example 1 having a Ra (CRI) of about 80 and Comparative Example 2 having a Ra (CRI) of about 90, and Exemplary Embodiment 1 having a Ra of about 80.

When the luminous flux of the lighting apparatus of Comparative Example 1 having Ra of 80 was 100, the luminous flux of Comparative Example 2 having Ra of 90 was reduced by 10% or more compared with Comparative Example 1. In contrast, the luminous flux of the lighting apparatus of Exemplary Embodiment 1 having Ra of 80 was slightly reduced compared with Comparative Example 1.

Meanwhile, the lighting apparatus of Comparative Example 1 having Ra of 80 had R8 of less than 60, and lighting apparatus of Comparative Example 2 having Ra of 90 had R8 of 80 or more. Meanwhile, for the Exemplary Embodiment 1, Ra was 80 and R8 was 72 or more.

That is, according to Exemplary Embodiment 1, two kinds of red phosphors having relatively small full widths at half maximum were mixed to use, and thus, it was possible to increase R8 to 72 or more while keeping Ra relatively low. On the other hand, when using nitride-based phosphors having relatively large full widths at half maximum as in Comparative Examples 1 and 2, it can be seen that Ra needs to be increased to achieve high R8, and thus, the luminous flux is considerably reduced.

Figure 7:
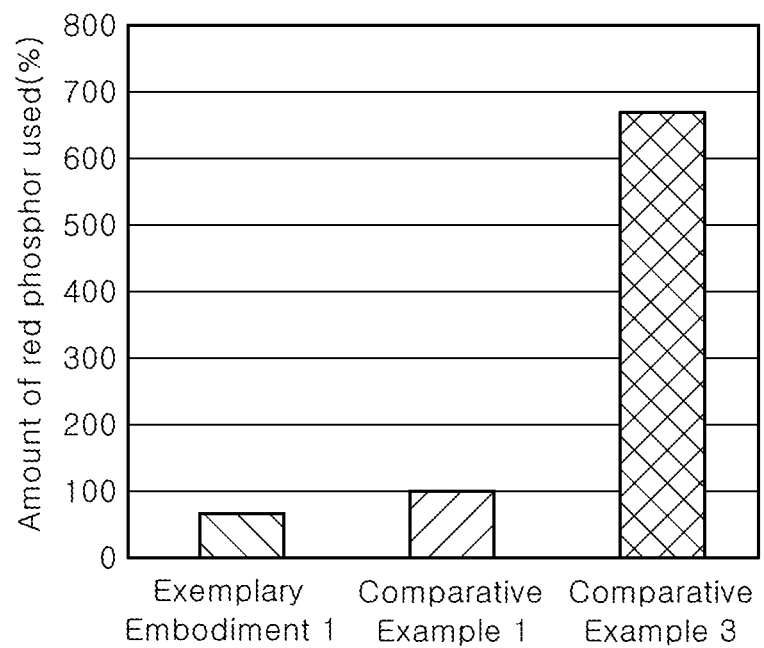
FIG. 7 is a graph showing amounts of phosphors used in lighting apparatuses.

FIG. 7 is a graph showing amounts of phosphors used in lighting apparatuses.

To achieve the same Ra 80, the amount of phosphors used in the lighting apparatus was compared. Comparative Example 1 and Exemplary Embodiment 1 are the same as described above, and Comparative Example 3 uses a KSF phosphor as a red phosphor.

When the amount of the nitride phosphor was 100%, the KSF phosphor was used more than six times, almost seven times, and an amount of the sulfide phosphor used was lower than that of the nitride phosphor.

Figure 8A:
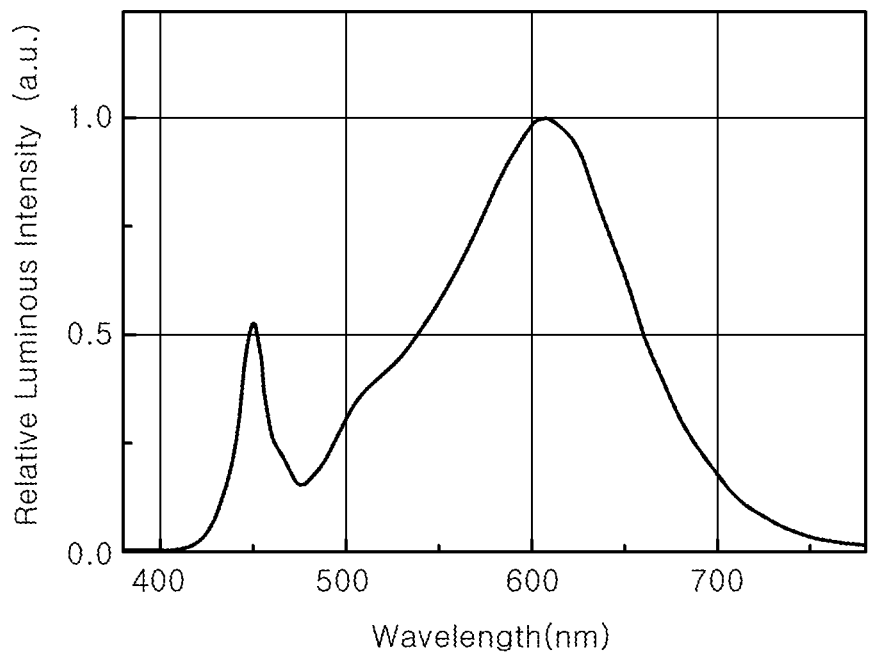
FIG. 8A and FIG. 8B are graphs showing emission spectra of a comparative example and an exemplary embodiment.
Figure 8B:
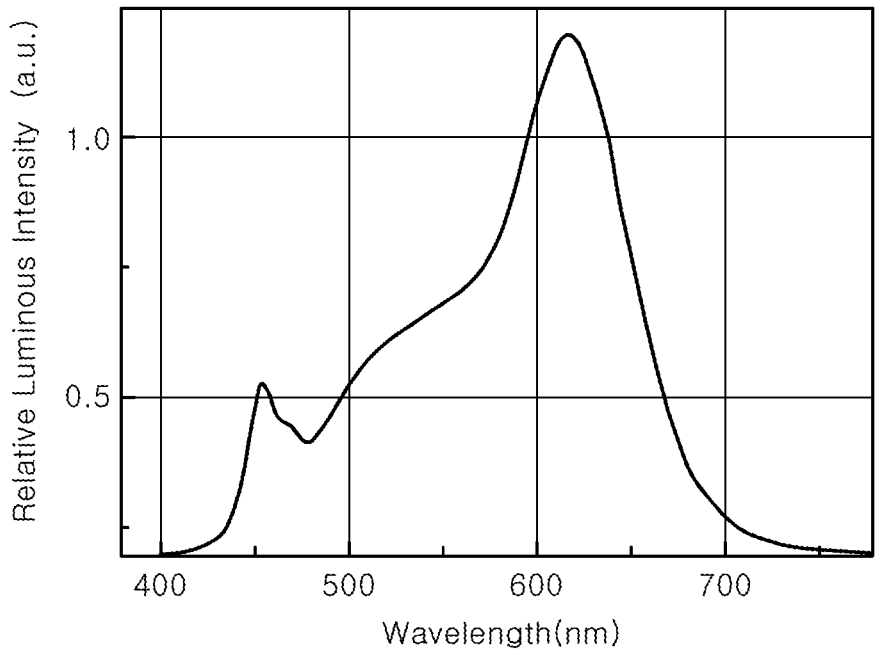

FIG. 8A and FIG. 8B are graphs showing emission spectra of Comparative Example 1 and Exemplary Embodiment 1.

As can be seen from FIG. 8A and FIG. 8B, when the red phosphor of Exemplary embodiment 1 having the narrow full width at half maximum is used, the luminous intensity of the red light wavelength region is improved. Furthermore, since the phosphors having the narrow full widths at half maximum are used, tails generated on a side of the long wavelength may be reduced, and thus, the luminous intensity may be increased while improving R8.

According to exemplary embodiments, since two kinds of red phosphors having full widths at half maximum in a range of 20 nm to 60 nm are used, favorable color rendering with R8 of 72 or more may be achieved without increasing the amount of phosphors used, thereby preventing the luminous intensity of a lighting apparatus from being reduced.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A lighting apparatus, comprising:
   at least one light emitting diode (LED) chip configured to emit blue light;
   a green phosphor having an emission peak in a range of 500 nm to 550 nm; and
   a red phosphor having an emission peak in a range of 600 nm to 650 nm,
   wherein the red phosphor comprises:
      a first red phosphor having an emission peak in a range of 620 nm to 630 nm; and
      a second red phosphor having an emission peak in a range of 630 nm to 640 nm,
   wherein the first red phosphor and the second red phosphor comprise (Ca, Sr)S:Eu-based phosphors and full widths at half maximum of the first red phosphor and the second red phosphor are in a range of 20 nm to 60 nm, respectively,
   wherein, in an emission spectrum, an intensity of light emitted from the lighting apparatus is configured to gradually increase from 500 nm to 600 nm, and
   wherein the intensity of light emitted from the lighting apparatus at 700 nm is configured to be less than about 10% of the maximum intensity of light emitted from the lighting apparatus.

2. The lighting apparatus of claim 1, wherein a general color rendering index (Ra) of the lighting apparatus is in a range of 80 to 98, and an R8 thereof is greater than 72.

3. The lighting apparatus of claim 1, wherein full widths at half maximum of the first red phosphor and the second red phosphor are in a range of 50 nm to 60 nm.

4. The lighting apparatus of claim 1, wherein the green phosphor includes a $Lu_3(Al, Ga)_5O_{12}$:Ce (LuAG)-based phosphor.

5. The lighting apparatus of claim 1, further comprising:
   a yellow phosphor having an emission peak in a range of 550 nm to 600 nm.

6. The lighting apparatus of claim 1, wherein the lighting apparatus is an LED lamp including an LED filament.

7. The lighting apparatus of claim 6, wherein:
   the LED filament comprises:
      a supporting substrate on which the LED chips are disposed;
      wires electrically connecting the LED chips; and
      an encapsulant covering the LED chips; and
   the green phosphor and red phosphor are distributed in the encapsulant.

8. The lighting apparatus of claim 7, wherein the encapsulant surrounds the supporting substrate.

9. The lighting apparatus of claim 1, wherein the maximum intensity of light emitted from the lighting apparatus is configured to be in a range of 600 nm to 650 nm.

10. An LED filament, comprising:
    a supporting substrate;
    a plurality of light emitting diode chips disposed on the supporting substrate, and configured to emit blue light; and
    an encapsulant covering the plurality of light emitting diode chips and having phosphors distributed therein,
    wherein the phosphors comprise:
       a green phosphor having an emission peak in a range of 500 nm to 550 nm; and
       a red phosphor having an emission peak in a range of 600 nm to 650 nm,
    wherein the red phosphor comprises:
       a first red phosphor having an emission peak in a range of 620 nm to 630 nm; and
       a second red phosphor having an emission peak in a range of 630 nm to 640 nm,
    wherein the first red phosphor and the second red phosphor comprise (Ca, Sr)S:Eu-based phosphors and full widths at half maximum of the first red phosphor and the second red phosphor are in a range of 20 nm to 60 nm, respectively,
    wherein, in an emission spectrum, an intensity of light emitted from the LED filament is configured to gradually increase from 500 nm to 600 nm, and
    wherein the intensity of light emitted from the LED filament at 700 nm is configured to be less than about 10% of the maximum intensity of light emitted from the lighting apparatus.

11. The LED filament of claim 10, wherein a general color rendering index (Ra) of the LED filament is in a range of 80 to 98, and an R8 thereof is greater than 72.

12. The LED filament of claim 10, wherein full widths at half maximum of the first red phosphor and the second red phosphor are in a range of 50 nm to 60 nm.

13. The LED filament of claim 10, wherein the maximum intensity of light emitted from the LED filament is configured to be in a range of 600 nm to 650 nm.

* * * * *